United States Patent
Gephardt et al.

(10) Patent No.: US 7,929,718 B1
(45) Date of Patent: Apr. 19, 2011

(54) SYSTEMS AND METHODS FOR SWITCHING AND MIXING SIGNALS IN A MULTI-CHANNEL AMPLIFIER

(75) Inventors: Douglas D. Gephardt, Dripping Springs, TX (US); Jack B. Andersen, Austin, TX (US); Larry E. Hand, Austin, TX (US)

(73) Assignee: D2Audio Corporation, Milpitas, CA (US)

( * ) Notice: Subject to any disclaimer, the term of this patent is extended or adjusted under 35 U.S.C. 154(b) by 1303 days.

(21) Appl. No.: 10/843,852

(22) Filed: May 12, 2004

Related U.S. Application Data (60) Provisional application No. 60/469,733, filed on May 12, 2003.

(51) Int. Cl.
- H03F 99/00 (2009.01)
- H02B 1/00 (2006.01)
- H04R 29/00 (2006.01)
- G06F 17/00 (2006.01)

(52) U.S. Cl. ............. 381/120; 381/123; 381/58; 700/94

(58) Field of Classification Search ............... 381/57–59, 381/120, 123, 118, 119; 700/94; 341/143
See application file for complete search history.

(56) References Cited

U.S. PATENT DOCUMENTS

| | | | |
|---|---|---|---|
| 4,121,058 A | 10/1978 | Jusko et al. | |
| 4,184,047 A | 1/1980 | Langford | |
| 4,414,862 A | 11/1983 | Kunugi | |
| 4,554,512 A | 11/1985 | Aiello | |
| 4,598,399 A | 7/1986 | Bath | |
| 4,641,326 A | 2/1987 | Tomisawa | |
| 4,700,391 A | 10/1987 | Leslie, Jr. et al. | |
| 4,727,505 A | 2/1988 | Konishi et al. | |
| 4,841,828 A | 6/1989 | Suzuki | |
| 5,023,825 A | 6/1991 | Luthra et al. | |
| 5,050,172 A | 9/1991 | Elms et al. | |

(Continued)

FOREIGN PATENT DOCUMENTS

EP 0353406 2/1990

(Continued)

OTHER PUBLICATIONS

Dunn et al., "Use of Clipping in Sigma-Delta Modulators," IEEE Colloquium on Oversampling Techniques and Sigma-Delta Modulation, Mar. 30, 1994, pp. 8/1-8/9.
English Language translation of Office Action dated Dec. 13, 2008, for Chinese Patent Application No. 200480009689.9.
English Language translation of Office Action dated Jan. 13, 2009, for Japanese Patent Application No. 2006-507396.

(Continued)

*Primary Examiner* — Vivian Chin
*Assistant Examiner* — George Monikang
(74) *Attorney, Agent, or Firm* — Fliesler Meyer LLP (57) ABSTRACT

Systems and methods for scaling the number of output channels that can be provided in an audio amplification system. In one embodiment, a digital pulse width modulation (PWM) amplification system includes multiple four-channel PWM controller chips that are interconnected to enable synchronization and transfer of digital audio data from one chip to another. Input audio signals received by each of the channels are processed by sample rate converters to generate internal audio signals that have a predetermined sample rate and format. Each of the channels is synchronized so that the internal audio signal of each channel can be processed and output by any of the other channels. The PWM controller chips are connected by a high-speed interconnect that enables the transfer of data between them. Each input audio signal can be mapped to any of the outputs and can be mixed with other input signals.

36 Claims, 7 Drawing Sheets

U.S. PATENT DOCUMENTS

| | | | |
|---|---|---|---|
| 5,118,997 A | 6/1992 | El-Hamamsy | |
| 5,285,263 A | 2/1994 | Fujita | |
| 5,319,584 A | 6/1994 | Ooyabu | |
| 5,367,162 A | 11/1994 | Holland et al. | |
| 5,390,180 A | 2/1995 | Reilly | |
| 5,471,411 A | 11/1995 | Adams et al. | |
| 5,475,628 A | 12/1995 | Adams et al. | |
| 5,481,568 A | 1/1996 | Yada | |
| 5,483,528 A * | 1/1996 | Christensen | 370/263 |
| 5,528,695 A | 6/1996 | Klippel | |
| 5,602,878 A | 2/1997 | Cross | |
| 5,621,805 A | 4/1997 | Loh et al. | |
| 5,642,387 A | 6/1997 | Fukasawa | |
| 5,647,008 A * | 7/1997 | Farhangi et al. | 381/119 |
| 5,648,922 A | 7/1997 | Han | |
| 5,649,054 A | 7/1997 | Oomen et al. | |
| 5,652,542 A | 7/1997 | Fink | |
| 5,719,526 A | 2/1998 | Fink | |
| 5,729,227 A | 3/1998 | Park | |
| 5,778,218 A | 7/1998 | Gulick | |
| 5,822,326 A | 10/1998 | Rainbolt | |
| 5,822,779 A | 10/1998 | Intrater et al. | |
| 5,875,250 A | 2/1999 | Kuo et al. | |
| 5,907,295 A | 5/1999 | Lin | |
| 5,907,482 A | 5/1999 | Otake | |
| 5,918,073 A | 6/1999 | Hewitt | |
| 5,928,313 A | 7/1999 | Thompson | |
| 5,959,501 A * | 9/1999 | Chester | 330/251 |
| 5,986,589 A | 11/1999 | Rosefield et al. | |
| 6,014,055 A | 1/2000 | Chester | |
| 6,038,516 A | 3/2000 | Alexander et al. | |
| 6,044,113 A | 3/2000 | Oltean | |
| 6,057,789 A | 5/2000 | Lin | |
| 6,061,410 A | 5/2000 | Linz | |
| 6,064,259 A | 5/2000 | Takita | |
| 6,124,895 A | 9/2000 | Fielder | |
| 6,134,268 A | 10/2000 | McCoy | |
| 6,157,331 A | 12/2000 | Liu et al. | |
| 6,208,671 B1 | 3/2001 | Paulos et al. | |
| 6,229,389 B1 | 5/2001 | Pullen et al. | |
| 6,232,833 B1 | 5/2001 | Pullen | |
| 6,294,954 B1 | 9/2001 | Melanson | |
| 6,324,235 B1 | 11/2001 | Savell et al. | |
| 6,373,334 B1 | 4/2002 | Melanson | |
| 6,389,139 B1 | 5/2002 | Curtis et al. | |
| 6,393,198 B1 | 5/2002 | LaMacchia | |
| 6,396,250 B1 | 5/2002 | Bridge | |
| 6,411,333 B1 | 6/2002 | Auld et al. | |
| 6,429,737 B1 | 8/2002 | O'Brien | |
| 6,498,531 B1 | 12/2002 | Ulrick et al. | |
| 6,529,073 B1 | 3/2003 | Highfill, III et al. | |
| 6,531,970 B2 | 3/2003 | McLaughlin et al. | |
| 6,593,807 B2 | 7/2003 | Groves et al. | |
| 6,639,956 B1 | 10/2003 | Song | |
| 6,666,338 B1 | 12/2003 | Midya et al. | |
| 6,683,494 B2 | 1/2004 | Stanley | |
| 6,731,162 B2 | 5/2004 | Yeongha et al. | |
| 6,737,917 B2 | 5/2004 | Ryoo et al. | |
| 6,744,310 B2 | 6/2004 | Honda | |
| 6,748,497 B1 | 6/2004 | Kang et al. | |
| 6,675,931 B2 | 7/2004 | Rabenko et al. | |
| 6,782,239 B2 | 8/2004 | Johnson et al. | |
| 6,799,234 B1 | 9/2004 | Moon et al. | |
| 6,801,922 B2 | 10/2004 | Goszewski et al. | |
| 6,812,785 B2 | 11/2004 | Masuda et al. | |
| 6,816,017 B2 | 11/2004 | Yamashita et al. | |
| 6,819,732 B1 | 11/2004 | Savell | |
| 6,854,053 B2 | 2/2005 | Burkhardt et al. | |
| 6,870,876 B1 | 3/2005 | Nohlgren et al. | |
| 6,917,242 B2 | 7/2005 | Masuda et al. | |
| 6,967,541 B2 * | 11/2005 | Hooley | 332/109 |
| 6,970,435 B1 | 11/2005 | Buchanan et al. | |
| 6,970,896 B2 | 11/2005 | Awad et al. | |
| 6,972,705 B1 | 12/2005 | Fei et al. | |
| 7,012,650 B2 | 3/2006 | Hu et al. | |
| 7,023,868 B2 | 4/2006 | Rabenko et al. | |
| 7,062,336 B1 * | 6/2006 | Yang et al. | 700/94 |
| 7,078,964 B2 | 7/2006 | Risbo et al. | |
| 7,099,426 B1 | 8/2006 | Cory et al. | |
| 7,167,112 B2 | 1/2007 | Andersen et al. | |
| 7,236,109 B1 | 6/2007 | Duewer et al. | |
| 7,262,716 B2 | 8/2007 | Yu et al. | |
| 7,286,010 B2 | 10/2007 | Chieng et al. | |
| 7,302,396 B1 | 11/2007 | Cooke | |
| 7,474,722 B1 | 1/2009 | Chieng et al. | |
| 2001/0010482 A1 | 8/2001 | Oki et al. | |
| 2001/0033583 A1 | 10/2001 | Rabenko et al. | |
| 2001/0052814 A1 | 12/2001 | Takita | |
| 2002/0046227 A1 | 4/2002 | Goszewski et al. | |
| 2002/0085725 A1 | 7/2002 | Bizjak | |
| 2002/0098812 A1 | 7/2002 | Sourour et al. | |
| 2002/0105448 A1 | 8/2002 | Freidhof | |
| 2002/0122518 A1 | 9/2002 | Yasuda et al. | |
| 2002/0131611 A1 * | 9/2002 | Hoover et al. | 381/123 |
| 2002/0167354 A1 | 11/2002 | Stanley | |
| 2002/0190880 A1 | 12/2002 | McLaughlin et al. | |
| 2003/0035064 A1 | 2/2003 | Torikoshi et al. | |
| 2003/0037297 A1 | 2/2003 | Araki | |
| 2003/0042976 A1 | 3/2003 | Midya et al. | |
| 2003/0058039 A1 | 3/2003 | Noro | |
| 2003/0074381 A1 | 4/2003 | Awad et al. | |
| 2003/0179116 A1 | 9/2003 | Oki | |
| 2004/0017854 A1 | 1/2004 | Hansen et al. | |
| 2004/0028243 A1 | 2/2004 | Seo et al. | |
| 2004/0036533 A1 | 2/2004 | Mazda | |
| 2004/0096073 A1 * | 5/2004 | Kim, II | 381/120 |
| 2004/0120361 A1 | 6/2004 | Yu et al. | |
| 2004/0184627 A1 | 9/2004 | Kost et al. | |
| 2004/0222846 A1 | 11/2004 | Melanson et al. | |

FOREIGN PATENT DOCUMENTS

| | | |
|---|---|---|
| EP | 1128549 | 8/2001 |
| EP | 1244208 | 8/2002 |
| GB | 2267193 | 11/1993 |
| GB | 2200817 | 8/1998 |
| JP | 2003-265309 | 11/1991 |
| JP | 2002-158543 | 5/2002 |
| JP | 2002-171140 | 6/2002 |
| JP | 2002-314429 | 10/2002 |
| JP | 2003-037452 | 2/2003 |
| JP | 2003-510878 | 3/2003 |
| JP | 2008-018518 | 1/2008 |
| WO | WO 01/03299 | 1/2001 |
| WO | WO 01/26222 | 4/2001 |

OTHER PUBLICATIONS

European Examination Report in connection with EP 04757929.7 dated Jun. 21, 2006, 3 pages.

International Search Report in connection with PCT/US2004/008547 completed Sep. 16, 2004, mailed Dec. 6, 2004, 5 pages.

Japanese Office Action in connection with JP 2006-507404 mailed Aug. 26, 2008, 2 pages.

Ketola et al., "Synchronization of Fractional Interval Counter in Non-Integer Ratio Sample Rate Converters,", Proceedings of the 2003 International Symposium on Circuits and Systems, 2003 ISCAS '03, vol. 2, May 25-28, 2003, pp. 89-92.

Meier, W. et al., "Software Amplitude Limitation in Digital Signal Processing Applications," Motorola Technical Developments, Motorola, Inc., Schaumburg, Il, US, vol. 25, Jul. 1, 1995.

Notice of Rejection for JP 2006-507403 (issued Nov. 12, 2008).

Park, Sangil et al., "A Novel Structure for Real-Time Digital Sample-Rate Converters with Finite Precision Error Analysis," Speech Processing 2, VLSI, Underwater Signal Processing, Toronto, May 14-17, 1991, International Conference on Acoustics, Speech and Signal Processing, ICASSP, NY, IEEE, US, vol. 2, Conf. 16, Apr. 14, 1991, 4 pages.

PC104 Audio Module, http://pc104.winsystems.com/products/pc104/pcmaudio.html.

Preliminary Amendment in connection with co-pending U.S. Appl. No. 12/359,021, filed Jan. 23, 2009, 7 pages.

Sozanski et al., "Digital control circuit for class-D audio power amplifier," Power Electronics Specialists Conference, 2001. PESC. 2001 IEEE 32nd Annual, vol. 2 (2001), pp. 1245 - 1250.

* cited by examiner

SYSTEMS AND METHODS FOR SWITCHING AND MIXING SIGNALS IN A MULTI-CHANNEL AMPLIFIER

RELATED APPLICATIONS

This application claims priority to: U.S. Provisional Patent Application No. 60/469,733, entitled "Matrix Mixing methods for Four-Channel Intelligent Amplifier," by Douglas D. Gephardt, filed May 12, 2003; U.S. patent application Ser. No. 10/805,569, entitled "Systems and Methods for Implementing a Sample Rate Converter Using Hardware and Software to Maximize Speed and Flexibility," by Andersen, et al., filed Mar. 20, 2004; and U.S. patent application Ser. No. 10/805,593, entitled "Multi-Chip PWM Synchronization and Communication," by Andersen, et al., filed Mar. 19, 2004, which in turn claims priority to U.S. Provisional Patent Application No. 60/469,734, entitled "Multi-chip PWM with Staggered Outputs," by Jack B. Andersen, et al., filed May 12, 2003 U.S. Provisional Patent Application No. 60/456,414, entitled "Adaptive Anti-Clipping Protection," by Taylor, et al., filed Mar. 21, 2003 U.S. Provisional Patent Application No. 60/456,430, entitled "Frequency Response Correction," by Taylor, et al., filed Mar. 21, 2003 U.S. Provisional Patent Application No. 60/456,429, entitled "High-Efficiency, High-Performance Sample Rate Converter," by Andersen, et al., filed Mar. 21, 2003 U.S. Provisional Patent Application No. 60/456,421, entitled "Output Device Switch Timing Correction," by Taylor, et al., filed Mar. 21, 2003 U.S. Provisional Patent Application No. 60/456,422, entitled "Output Filter, Phase/Timing Correction," by Taylor, et al., filed Mar. 21, 2003 U.S. Provisional Patent Application No. 60/456,428, entitled "Output Filter Speaker/Load Compensation," by Taylor, et al., filed Mar. 21, 2003 U.S. Provisional Patent Application No. 60/456,420, entitled "Output Stage Channel Timing Calibration," by Taylor, et al., filed Mar. 21, 2003 U.S. Provisional Patent Application No. 60/456,427, entitled "Intelligent Over-Current, Over-Load Protection," by Hand, et al., filed Mar. 21, 2003; each of which is fully incorporated by reference as if set forth herein in its entirety.

BACKGROUND OF THE INVENTION

1. Field of the Invention

The invention relates generally to audio amplification systems, and more particularly to systems and methods for converting input data streams having a first sample rate to output data streams having a second data rate.

2. Related Art

Pulse Width Modulation (PWM) or Class D signal amplification technology has existed for a number of years. PWM technology has become more popular with the proliferation of Switched Mode Power Supplies (SMPS). Since this technology emerged, there has been an increased interest in applying PWM techniques in signal amplification applications as a result of the significant efficiency improvement that can be realized through the use of Class D power output topology instead of the legacy (linear Class AB) power output topology.

Early attempts to develop signal amplification applications utilized the same approach to amplification that was being used in the early SMPS. More particularly, these attempts utilized analog modulation schemes that resulted in low performance applications. These applications were complex and costly to implement. Consequently, these solutions were not widely accepted. Prior art analog implementations of Class D technology have therefore been unable to displace legacy Class AB amplifiers in mainstream amplifier applications.

Recently, digital PWM modulation schemes have surfaced. These schemes use Sigma-Delta modulation techniques to generate the PWM signals used in the newer digital Class D implementations. These digital PWM schemes, however, did little to offset the major barriers to integration of PWM modulators into the total amplifier solution. Class D technology has therefore continued to be unable to displace legacy Class AB amplifiers in mainstream applications.

There are a number of problems with existing digital PWM modulation schemes. One of the problems is that audio system implementations are requiring increasing numbers of channels, and increasing flexibility in routing signals through the different channels. For example, it may be desired to design a home audio system that provides audio to all of the rooms in the house. This system may need to be able to provide music to all of the rooms or selected ones of the rooms. The system may also need to be able to provide different audio signals to different rooms. For instance, audio from a home theater system may be provided to the speakers in a home theater room, while background music may be provided to all of the other rooms. It may also be desirable for the system to be able to mix audio signals that are provided to the different rooms. For instance, an intercom signal may be mixed with the background music or other audio signals. Similarly, a business application may require the ability to provide audio to many different speakers in a building. It may be desirable to have the capability of routing various different audio signals to the different speakers so that announcements can be directed to specific areas, so that music can be provided in different areas, and so on.

These and other such applications generally require more channels than are provided in a conventional system. Existing digital PWM amplification systems typically have only as many channels as can be implemented on a single chip (e.g., two or four channels). While it is possible to provide additional channels on a single chip, this typically is not a practical solution for several reasons. For example, there simply may not be enough space on the chip to implement the additional channels. It may also be possible that there are not enough resources (e.g., processor cycles) to process all of the channels on the same chip. Further, the complexity of the design may increase dramatically with the additional channels (which would also dramatically increase the cost). Still further, even if a few additional channels could be accommodated, such a solution would not address the next generation of system requirements in which still more channels would likely be required. Still further, there are difficulties that are associated with the interaction of multiple chips, such as the synchronization of the chips. It would be necessary to synchronize the chips in order to provide coherent control of all of the channels in the system and to allow switching and mixing of the audio signals among the different channels, as desired for the home and business applications described above.

SUMMARY OF THE INVENTION

One or more of the problems outlined above may be solved by the various embodiments of the invention. Broadly speaking, the invention comprises systems and methods for scaling the number of output channels that can be provided in an audio amplification system.

In one embodiment, a digital pulse width modulation (PWM) amplification system includes multiple four-channel PWM controller chips. The PWM controller chips are interconnected to enable them to be synchronized and to transfer digital audio data from one chip to another. In this embodiment, each channel has an input portion (an input channel) and an output portion (an output channel.) A different input audio signal can be received by each of the input channels on each of the PWM controller chips. These input audio signals can have different sample rates. Each input audio signal is processed by a sample rate converter to generate an internal audio signal that has a predetermined internal sample rate (e.g., 100 kHz). Each of the channels within a PWM controller chip is synchronized. Further, each PWM controller chip is synchronized with the other chips so that the internal audio signals of all of the channels are synchronized. The PWM controller chips are connected by a high-speed interconnect that enables the transfer of data between PWM controller chips. In this embodiment, the internal audio signal of each of the channels is made available to each of the other channels, so that each input of the system can be mapped to any of the outputs of the system. Further, two or more of the input signals can be mixed and provided at selected outputs of the system.

One embodiment comprises a system that includes a plurality of audio amplifier channels, and a data transport medium coupled to each of the audio amplifier channels. Each of the audio amplifier channels has an input portion (input channel) and an output portion (output channel.) Each of the input channels is configured to receive a corresponding audio signal and to convert the corresponding audio signal to a predetermined digital data format. The data transport medium is configured to transmit audio signals in the predetermined digital data format from one or more of the audio amplifier channels to one or more others of the audio amplifier channels. The output channels can then select one or more of the audio signals and provide an output signal based on the selected audio signals. In one embodiment, each input signal can be mapped to any one of the outputs of the system, and multiple ones of the input signals can be mixed to form a composite signal that is provided at a selected output.

Another embodiment comprises a method that includes receiving audio signals in multiple audio amplifier channels, converting the received audio signals to a single, predetermined digital format, transmitting the converted audio signals from at least a first one of the audio amplifier channels to a second one of the audio amplifier channels, selecting at least one audio signal in the second one of the audio amplifier channels and processing the selected audio signals the second one of the audio amplifier channels to generate an output audio signal. In one embodiment, the various input audio signals are independently mapped to the outputs of the channels. In another embodiment, the various input audio signals are mixed and provided at selected outputs of the channels.

Numerous additional embodiments are also possible.

BRIEF DESCRIPTION OF THE DRAWINGS

Other objects and advantages of the invention may become apparent upon reading the following detailed description and upon reference to the accompanying drawings.

While the invention is subject to various modifications and alternative forms, specific embodiments thereof are shown by way of example in the drawings and the accompanying detailed description. It should be understood, however, that the drawings and detailed description are not intended to limit the invention to the particular embodiment which is described. This disclosure is instead intended to cover all modifications, equivalents and alternatives falling within the scope of the present invention as defined by the appended claims.

DETAILED DESCRIPTION OF PREFERRED EMBODIMENTS

One or more embodiments of the invention are described below. It should be noted that these and any other embodiments described below are exemplary and are intended to be illustrative of the invention rather than limiting.

As described herein, various embodiments of the invention comprise systems and methods for scaling the number of output channels that can be provided in an audio amplification system.

In one embodiment, the invention is implemented in a digital pulse width modulation (PWM) amplification system. This system includes multiple four-channel PWM controller chips that provide PWM output signals to corresponding drivers and output stages, which in turn drive speakers. The PWM controller chips are interconnected to enable them to be synchronized and to transfer digital audio data from one chip to another.

In this embodiment, a different input audio signal can be received by each of the channels on each of the PWM controller chips. These input audio signals can have different sample rates. Each input audio signal is processed by a sample rate converter to generate an internal audio signal that has a predetermined internal sample rate (e.g., 100 kHz).

Each of the channels within a PWM controller chip is synchronized. Further, each PWM controller chip is synchronized with the other chips so that the internal audio signals of all of the channels are synchronized. The PWM controller chips are connected by a high-speed interconnect that enables the transfer of data between PWM controller chips. In one embodiment, the internal audio signal of each of the channels is made available to each of the other channels. One or more of the input signals can then be selected by each of the channels for processing and output to the corresponding output stage. Each input of this system can be mapped to any of the outputs of the system. Further, two or more of the input signals can be mixed and provided at selected outputs of the system.

Figure 1:
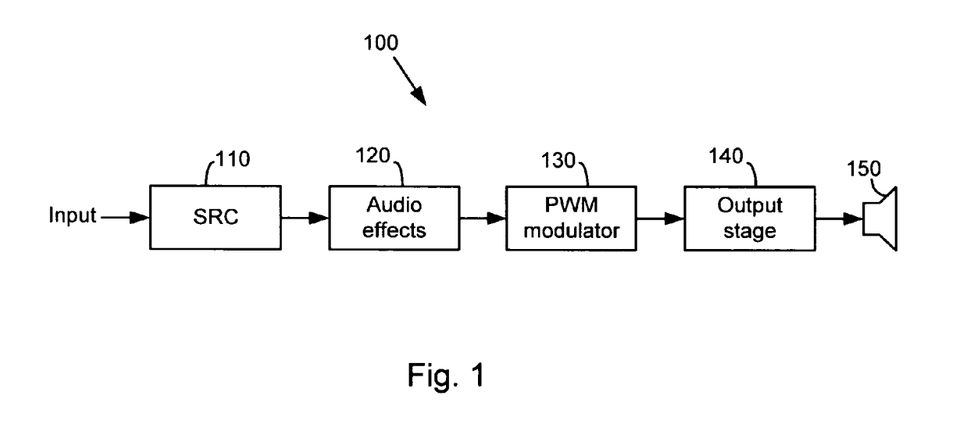
FIG. 1 is a functional block diagram illustrating a digital audio amplification system using PWM technology in accordance with one embodiment.

Referring to FIG. 1, a functional block diagram illustrating a digital audio amplification system using PWM technology is shown. In this embodiment, system 100 receives a digital input data stream from a data source such as a CD player, MP3 player, digital audio tape, or the like. The input data stream is received by sample rate converter 110. The input data stream has a particular sample rate which depends upon the data source. This sample rate is typically one of a set of predetermined sample rates that are used by the corresponding type of device. For example, a CD player may output digital data with a sample rate of 44.1 kHz, while a digital audio tape player may output data with a sample rate of 32 kHz.

In the present systems and methods, sample rate converter 110 converts the input data stream from the sample rate at which it was received to a predetermined internal rate which is used within system 100. In one embodiment, this internal sample rate is 100 kHz. Thus, if data is received at a sample rate of 50 kHz, sample rate converter 110 will re-sample the data to produce a corresponding internal data stream at a sample rate of 100 kHz. This internal data stream is then provided to an audio effects subsystem 120. Audio effects subsystem 120 performs any desired processing on the internal data stream and provides the resulting processed data stream to PWM modulator 130.

The data stream received by PWM modulator 130 represents a pulse code modulated signal. PWM modulator 130 converts this data stream to a pulse width modulated signal. The pulse width modulated signal is then provided to output stage 140. In output stage 140 amplifies the pulse width modulated signal and may perform some filtering or further processing of the amplified signal. The resulting signal is then output to a speaker system 150, which converts the electrical signal to an audible signal which can be heard by a listener.

Channel 100 is implemented in a single chip. It is common for two or even four channels to be implemented in the same chip. Each additional channel typically replicates the components of the first channel. As mentioned above, however, if it is necessary or desirable to provide more channels (e.g., eight, sixteen, or even more), it may be necessary to use multiple chips, each having several channels. Further, it may be desirable to couple these chips in a way that allows various input audio signals to be switched to selected ones of the channels, and even to be combined for output on a single channel.

Figure 2:
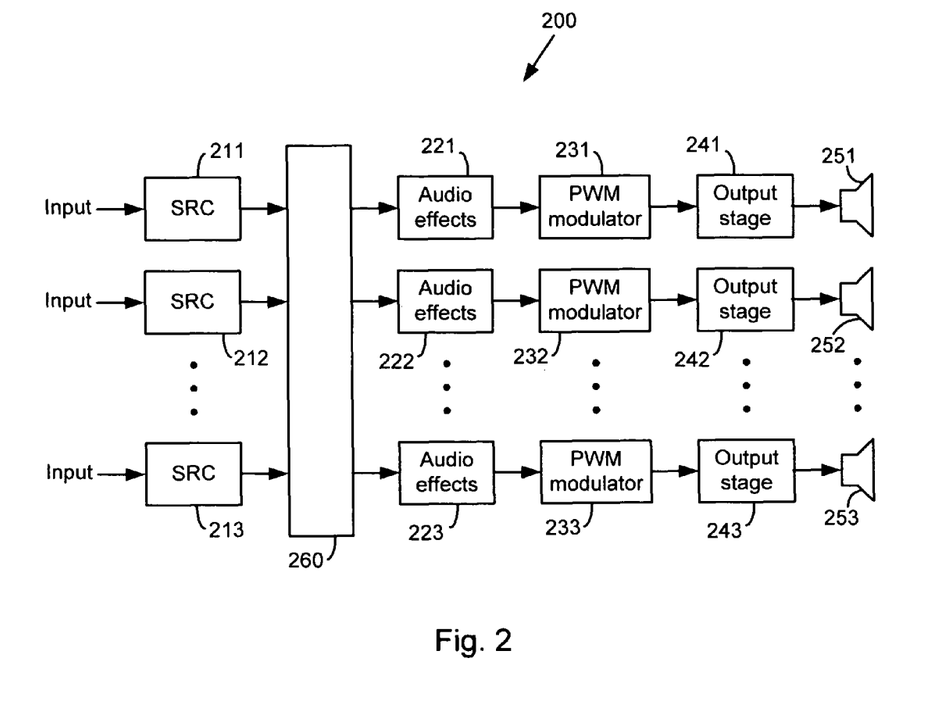
FIG. 2 is a functional block diagram illustrating an exemplary multiple-channel digital audio amplification system in accordance with one embodiment.

Referring to FIG. 2, a functional block diagram illustrating an exemplary multiple-channel digital audio amplification system is shown. As shown in this figure, system 200 has n channels, 201-203. (Although only three of the channels are shown in the figure, the number of channels, n, in system 200 could be eight, twelve, sixteen, or even more.) Each channel has essentially the same structure as system 100 of FIG. 1. Each channel therefore includes a sample rate converter (211-213) for converting an input data stream from a sample rate at which it is received to a predetermined internal rate which is used within the channel. Each channel also includes an audio effects subsystem (221-223) to perform desired audio processing on the data stream, a PWM modulator (231-233) to form a PWM audio signal from the data stream, and an output stage (241-243) to generate an output audio signal that can be used to drive a speaker (251-253).

The channels of system 200 differ from the channel of system 100, however, in that they incorporate a matrix switch 260 between the sample rate converters, 211-213, and the audio effects processors, 221-223. In this embodiment, matrix switch 260 comprises a single switch, although this structure could vary in other embodiments. In this embodiment, matrix switch 260 is an n×n switch. In other words, matrix switch 260 has n inputs and n outputs. Each of the n inputs of matrix switch 260 is coupled to a corresponding one of sample rate converters 211-213. Each of the n outputs of matrix switch 260 is coupled to a corresponding one of audio effects processors 221-223.

It should be noted that, while the system of FIG. 2 incorporates the matrix switch between the sample rate converters and the audio effects processors of the respective channels, alternative embodiments of the system could be configured to incorporate the matrix switch in other positions, such as between the audio effects processors and the PWM modulators. It should also be noted that, in other embodiments, the matrix switch can be implemented via various different types of transport media that are configured to transport data from a sample rate converter of one channel to the audio effects processor/PWM modulator of another channel, and is not necessarily a switch. For example, in one embodiment, the matrix switch can be implemented as a bus in which data corresponding to a particular input is distributed to all of the outputs and the input can be selected as needed at the different outputs. This will be explained in more detail below in connection with various alternative embodiments.

Each of the n inputs of matrix switch 260 can be independently switched to any of the n outputs. As a result, the output of any one of sample rate converters 211-213 can be switched to any one of audio effects processors 221-223. The signal received by each of audio effects processors 221-223 is then processed by the remainder of the channel to generate a corresponding audio output signal. Thus, for example, a signal received by sample rate converter 211 can be converted and then switched to audio effects processor 222. The signal would then be processed by PWM modulator 232 and output stage 242, then provided to speaker 252.

The multi-channel digital amplification system of FIG. 2 takes advantage of two characteristics of channels 201-203. The first of these characteristics is that the sample rate converter of each channel is configured to receive an audio signal and to convert this signal to a predetermined, common format. In one embodiment, the sample rate converter of each channel is configured to receive PCM audio signal at some input sample rate, and to convert this signal to a predetermined, internal sample rate. In one embodiment, this predetermined, internal sample rate is 100 kHz. Thus, regardless of whether a signal is received from, for example, a CD player at a 44.1 kHz sample rate, or a digital audio tape player at a 32 kHz sample rate, the signal is up-sampled to a sample rate of 100 kHz.

Another characteristic of the channels of system 200 is that each of these channels is synchronized with the others. Because the channels are synchronized with each other, the data streams produced by each of the sample rate converters are also synchronized with each other. The data from the different data streams (in the different channels) can therefore be swapped between channels, distributed among the channels, combined in one or more channels, and so on.

Because the data output by each of the sample rate converters has a common format and is synchronous, it does not matter whether the data stream produced by any particular sample rate converter is processed by the remaining components (i.e., audio effects processor, PWM modulator and output stage) of the same channel, or the same components of a different channel. If the data stream can be physically redirected from one channel to another, it can be processed and output by any of the channels.

The matrix switch in the system of FIG. 2 serves to redirect the data streams from channel to channel. The matrix switch can be configured in various ways. For example, it may be configured to provide a one-to-one mapping of inputs to outputs. That is, each of the inputs to the matrix switch may be provided at exactly one of the outputs of the switch. On the other hand, the matrix switch may be configured to provide a one-to-many mapping of inputs to outputs. In other words, a signal received at a particular one of the inputs of the switch may be provided at several of the switch's outputs. Still further, the matrix switch may be configured to provide a many-to-one mapping of inputs to outputs. In this case, signals received at two or more of the switch's inputs would be combined and provided at one of the switch's outputs. The matrix switch may therefore provide signal mixing capabilities in addition to simple switching. Still other variations may be possible.

It is contemplated that the matrix switch in a preferred embodiment will be dynamically reconfigurable. Although not shown separately in the diagram of FIG. 2, control logic may be provided for the purpose of reconfiguring the matrix switch. This control logic may be external to the audio amplifier channels, or it may be internal. For example, if the audio amplifier channels are implemented in one or more digital signal processors (DSPs), the control logic may comprise program instructions within the DSP. The control logic may accept user input or input from other components of the system, and may reconfigure the matrix switch based upon this input. For example, if the system provides intercom functionality, a user may depress an activation switch to enable the intercom before speaking into a microphone that is coupled to one of the inputs of the system. The control logic may, in response to a signal generated by the activation switch, reconfigure the matrix switch so that an input signal received on an intercom channel is combined with audio signals that are already being provided at multiple outputs of the matrix switch. The combined signals are then processed by the respective channels so that the intercom audio can be heard on the corresponding speakers in addition to the original audio (e.g., music) on those channels.

As pointed out above, one of the characteristics of the channels of multi-channel digital audio amplification system 200 is that the audio signals received by each of the channels are converted to a common, predetermined internal sample rate by the respective sample rate converters (211-213). Sample rate converters 211-213 employ polyphase filters to perform the up-sampling of the received audio data streams. Rather than up-sampling to a much higher sample rate than is ultimately desired and then decimating (removing unwanted samples), the use of a polyphase filter achieves the same result by interpolating the received audio data streams at points corresponding to the desired sample rate.

The use of a polyphase filter provides the number of advantages over the prior art, in which FIR-type filters were typically used to up-sample audio data to a very high sample rate and then decimate down to the desired sample rate. For instance, since it is not necessary to up-sample to a sample rate which is much higher than needed, it is not necessary to provide memory to store samples that will ultimately be discarded. Similarly, no processing power is used to generate these unneeded samples. Further, polyphase filtering can accommodate different sample rates, and variations between sample rates that are nominally the same, because this process is not constrained to up-sampling by an integer factor and then down-sampling by another integer factor.

Figure 3:
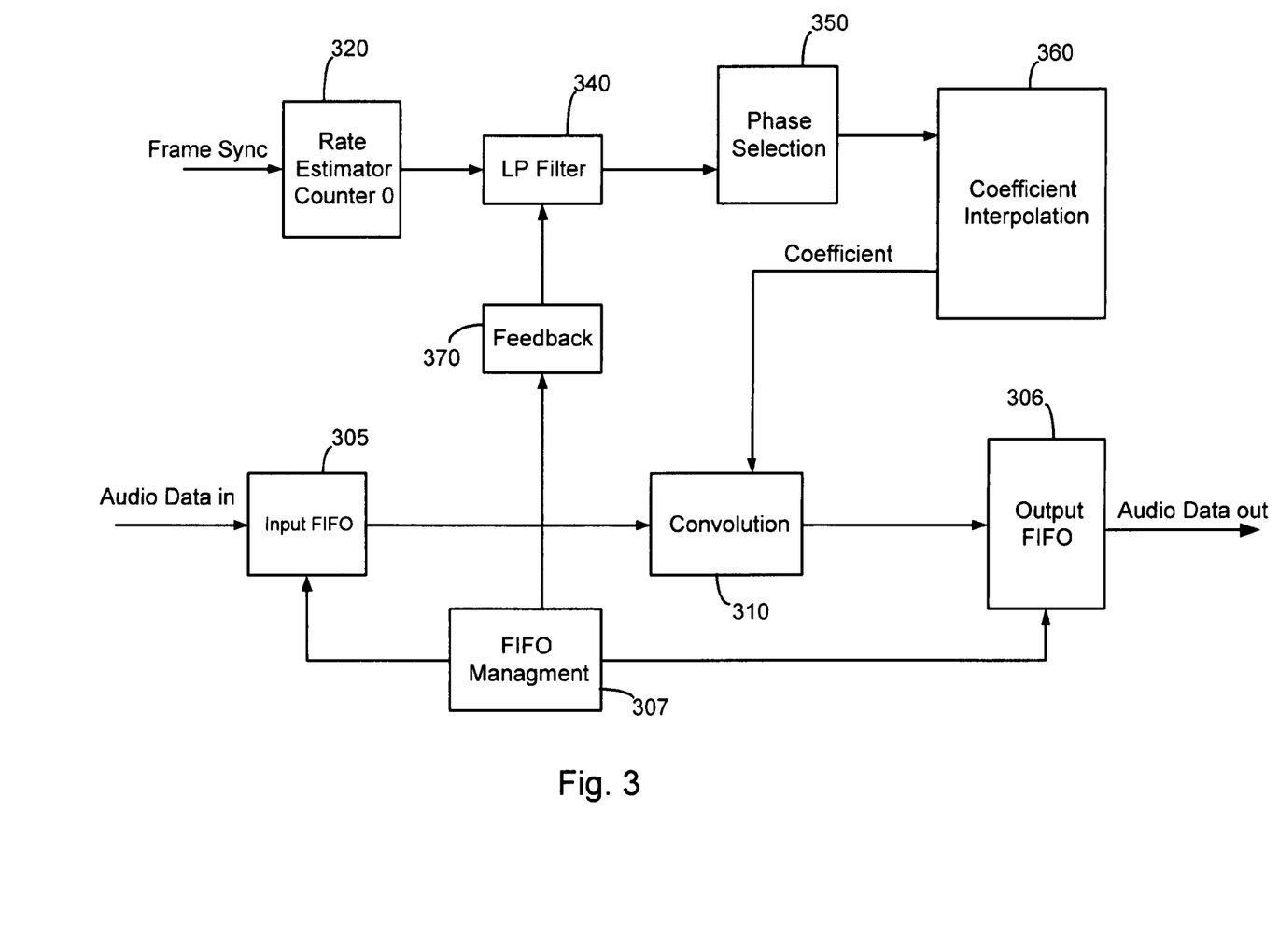
FIG. 3 is a functional block diagram illustrating an embodiment of a sample rate converter that is suitable for use in a system such as the one shown in FIG. 2.

An exemplary sample rate converter that is suitable for use in a system such as the one shown in FIG. 2 is illustrated in the functional block diagram of FIG. 3. In this figure, samples of an audio data stream are received and stored in an input FIFO 305. The input data stream has a sample rate of $F_{in}$. The samples are read from FIFO 305 and convolved with a set of interpolated coefficients by convolution engine 310. Convolution engine 310 effectively up-samples or down-samples the data to produce samples at a rate equivalent to the output rate ($F_{out}$) of the sample rate converter. These samples are stored in an output FIFO 306. The samples are then read out of output FIFO 306 at rate $F_{out}$.

Frame sync signals associated with the audio data are received by rate estimator counter 320. Rate estimator counter 320 simply counts the numbers of clock cycles between received samples of the audio signal. The count from rate estimator counter 320 is filtered by low pass filter 340. The filtered sample rate count is forwarded to phase selection unit 350, and is used to interpolate the filter coefficients for the polyphase filter. The interpolated polyphase filter coefficients are then convolved with the data samples in convolution unit 310 to produce the re-sampled data.

The flow of data samples through FIFO 305 and FIFO 306 are managed by FIFO management unit 307. Based on the flow of data, FIFO management unit 307 provides feedback to feedback unit 370. This feedback is used to adjust low pass filter 340. This effectively adjusts the sample rate that is estimated and thereby adjusts the coefficient interpolation performed in the sample rate converter. The sample rate conversion is thereby also adjusted to more closely track the actual input sample rate and to prevent the overflow or underflow of FIFOs 305 and 306.

A sample rate converter of the type illustrated in FIG. 3 is described in detail in U.S. patent application Ser. No. 10/805,569, entitled "Systems and Methods for Implementing a Sample Rate Converter Using Hardware and Software to Maximize Speed and Flexibility," filed by Jack B. Andersen, et al. on Mar. 20, 2004. This application is incorporated by reference in its entirety. It should be noted that other types of sample rate converters and other mechanisms for converting the input signal to a common format may also be used in other embodiments.

Another of the characteristics pointed out above with respect to audio amplification system 200 is that the channels are synchronized. While it is a relatively straightforward matter to synchronize the operation of channels on a single chip, it is a more complicated matter to synchronize channels that are on different chips. Because a chip will typically contain no more than four channels, an audio amplification system such as system 200 that needs to have more than four channels will likely have to be implemented using multiple chips. Consequently, the channels on these chips will need to be synchronized.

In one embodiment, the channels of the audio amplification system are implemented using multiple PWM controllers. In this embodiment, the PWM controller includes a sample rate converter, an audio effects processor and a PWM modulator. The output of the PWM controller is provided to an output stage (or to a driver for the output stage).

Figure 4:
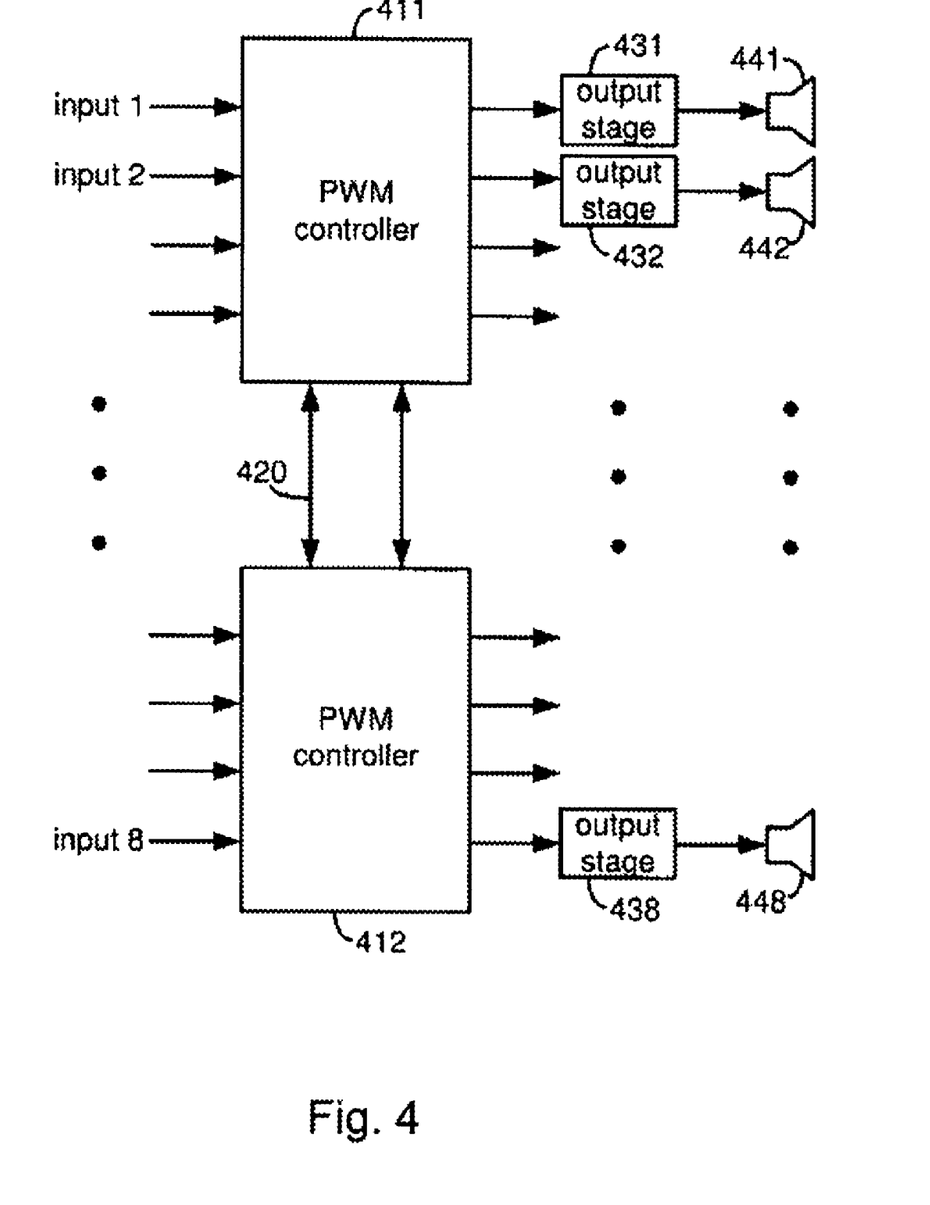
FIG. 4 is a functional block diagram illustrating an embodiment of a digital audio amplification system that employs two PWM controllers on separate chips.

Referring to FIG. 4, a functional block diagram illustrating an embodiment of digital audio amplification system 400 that employs two PWM controllers on separate chips is shown. In this figure, two PWM controller chips, 411 and 412, are used. Each of PWM controller chips 411 and 412 has four channels. Each channel includes a sample rate converter, an audio effects processor and a PWM modulator. It should be noted, however, that "channel," as used here, corresponds to a grouping of components, rather than a unique signal processing path.

Each of PWM controller chips 411 and 412 receives four input signals. Each of the input signals is processed by a corresponding sample rate converter to produce an internal signal in an identical format. Each of the internal signals within the chip is generated in such a manner that the signals are synchronized. The channels of the PWM controller chips are interconnected, however, so that the signal generated by the sample rate converter of a particular channel need not be processed by the audio effects processor and PWM modulator of that channel. Each of the signals produced by the four sample rate converters is made available to each of the four audio effects processor/PWM modulator pairs. Any one of the signals can then be selected (via provided control logic) to be processed by the respective audio effects processor/PWM modulator pairs.

In addition to having the four locally generated internal signals available for processing by the audio effects processor/PWM modulator pairs, the internal signals generated by the sample rate converters of the other chip are made available via a high-speed data interconnect 420 coupled between PWM controller chips 411 and 412. High-speed data interconnect 420 may, for example, be an ESSI (Enhanced Synchronous Serial Interface) interconnect. PWM controller chips 411 and 412 are synchronized via control signals that are communicated between them (as will be described in more detail below), so no additional processing of the signals is necessary to synchronize them before they can be used by other channels' audio effects processors and PWM modulators. It may, however, be necessary to add a delay to the locally generated data in order to match delays that may be incurred in transferring data from other chips.

Once a signal is selected for processing by a channel's audio effects processor and PWM modulator, the signal is processed to generate a PWM output signal that is provided to a corresponding one of output stages 431-438. The output stage generates an output signal that drives a corresponding one of speakers 441-448. While a single signal can be processed and output on each of the channels, it should be noted that each channel may also be configured to combine signals from multiple sample rate converters or otherwise manipulate the signals before generating a corresponding output signal.

Figure 5:
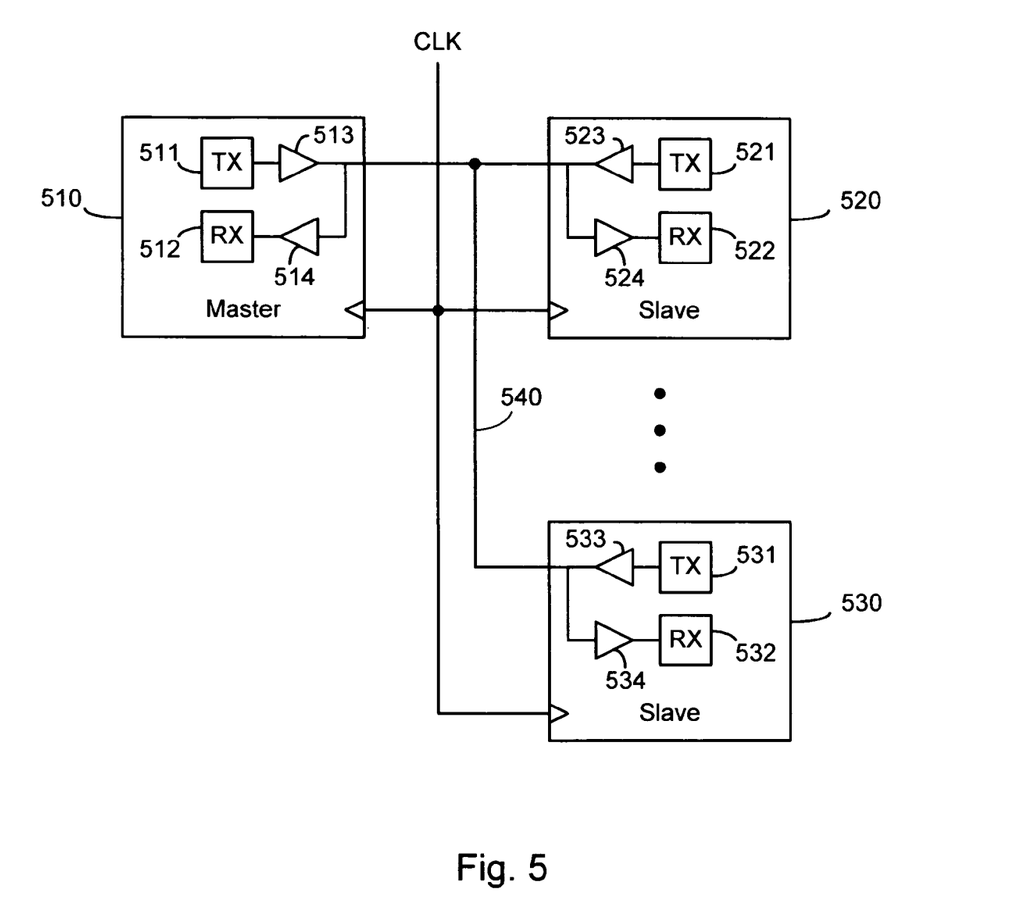
FIG. 5 is a diagram illustrating a synchronization system for PWM controller chips in accordance with one embodiment.

Referring to FIG. 5, the synchronization system for the PWM controller chips in one embodiment is shown. This embodiment is described in detail in U.S. patent application Ser. No. 10/805,593, entitled "Multi-Chip PWM Synchronization and Communication," by Andersen, et al., filed Mar. 19, 2004, which is incorporated herein by reference. In this embodiment, Three PWM controller chips (510, 520 and 530) are illustrated. One chip, 510, is the designated master and the other chips, 520 and 530, are slaves. The role of each chip is assigned when the chips are initialized. All of the chips run off a common clock source that provides a clock signal, CLK. This clock source may be a distributed high speed clock or a lower speed distributed clock that uses PLLs with a common multiplication factor to generate a higher-speed clock signal.

One wire, 540, which is connected to each of the chips is used for synchronization. (Although the interconnect between the different chips is referred to herein as a "wire", it should be noted that any suitable type of interconnect can be used.) In this embodiment, the wire can be in one of two states: active or passive. The actual encoding (high/low) will depend on the particular implementation. Within the master chip, synchronization wire 540 is coupled to a transmit unit 511 and a receive unit 512 via corresponding drivers 513 and 514. Each of slave chips 520 is coupled to synchronization wire 530 in the same manner. The transmit units are identified as items 521 and 531, and receive units are identified as items 522 and 532, respectively in the slave controller chips. The corresponding drivers are labeled as items 523, 524, 533 and 534.

When it is necessary for master controller chip 510 to communicate with slave chips 520 and 530, the appropriate signal is generated by transmit unit 511. The signal is driven onto synchronization wire 540 by driver 513. At each of the slave chips, the signal is amplified by the corresponding driver and forwarded to the corresponding receive unit 522, from which it is passed to the PWM engine of the controller chip. If it is necessary for one of slaves 520 or 530 to communicate with the master, it can do so by causing all of the controller chips to lose synchronization. In other words, a signal is generated by the corresponding transmit unit and driven onto synchronization wire 540 by the corresponding driver. The signal is then received by the driver and receive unit of each of the controller chips.

It should be noted that, with respect to the synchronization of the controller chips, the transition signal indicating that the chips should start operating is received by all of the chips, including the master, in one embodiment. Thus, both the master and the slaves watch the synchronization wire for the transition. When the master sees the transition, it begins operation, just as the slaves do. The master and slaves may therefore be identically configured with respect to the way each begins synchronous operation.

In one embodiment, after initialization, the master assumes control of the wire and drives it into its passive state. All the chips (both master and slaves) then set up and prepare to run (generate audio). All chips (master and slaves) monitor the wire for a transition to the active state. The fact that all chips are ready to run can be ensured in one embodiment by waiting for a known time to start up. In another embodiment, the readiness of the chips can be communicated by other shared communication channels. In still other embodiments, other alternative mechanisms may be used. When all of the chips are ready, the master generates a transition to the active state on the wire. All of the chips then start up simultaneously when they detect the transition.

As shown in FIG. 5, some embodiments can have three or even more PWM controller chips. While the number of PWM controller chips is not inherently limited, the number may be limited somewhat by factors such as the amount of data that can be moved from one chip to another. If it is desired to make audio that is input to each channel available to all of the other channels, larger numbers of channels obviously require the transfer of more data between chips. On the other hand, if more output channels are desired, but it is not necessary to make a large number of input signals available to each channel, it may be possible to transfer much less data between chips. It may therefore be much easier to scale the system.

Figure 6:
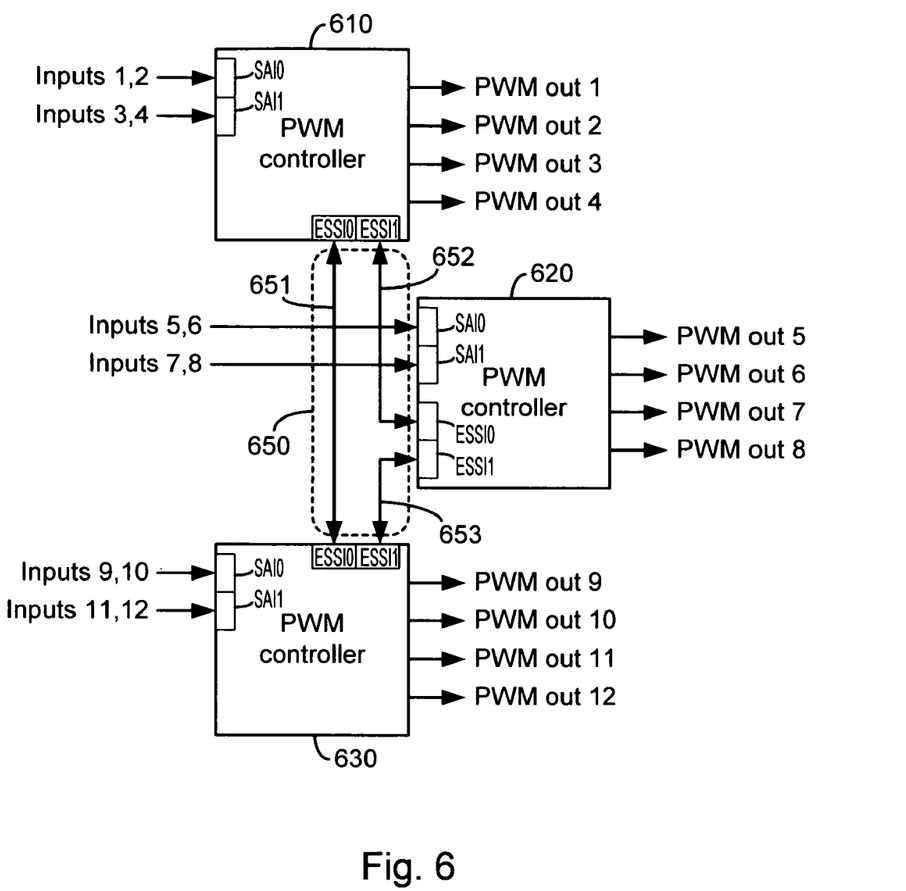
FIG. 6 is a functional block diagram illustrating a multiple-channel, multiple-chip digital audio amplification system in accordance with an alternative embodiment.

Referring to FIG. 6, another alternative embodiment of an audio amplifier system is shown. In this embodiment, In this embodiment, system 600 includes three PWM controllers, 610, 620 and 630. Each of the PWM controllers has four channels (four inputs and four outputs). There are therefore a total of 12 inputs and 12 outputs. In this embodiment, each of the 12 inputs is different, and each of these 12 different inputs is made available to each one of the 12 channels. Since each of the PWM controllers initially receives four of these inputs, it is necessary to provide the other eight inputs to each PWM controller via high-speed interconnect 650. Each of the 12 outputs of the PWM controllers can then be controlled to select one (or more) of the 12 inputs to be provided to a corresponding output stage.

High-speed interconnect 650 is configured to connect the respective ESSI ports of PWM controller chips 610, 620 and 630 to enable the transfer of this data between the PWM controllers. More specifically, interconnect 650 consists of three sub-interconnects, 651-653. Sub-interconnect 651 couples ESSI port 0 of PWM controller 610 to ESSI port 0 of PWM controller 630, sub-interconnect 652 couples ESSI port 1 of PWM controller 610 to ESSI port 0 of PWM controller 620, and sub-interconnect 653 couples ESSI port 1 of PWM controller 620 to ESSI port 1 of PWM controller 630. Sub-interconnect 651 is used to transfer input signals from PWM controller 610 to PWM controller 630 and to transfer input signals from PWM controller 630 to PWM controller 610. Similarly, sub-interconnect 652 is used to transfer input signals between PWM controller 610 and PWM controller 620, and sub-interconnect 653 is used to transfer input signals between PWM controller 620 and PWM controller 630.

In one embodiment, the data is transferred over interconnect 650 using time division multiplexing (TDM). In other words, there are time-based slots that are assigned to the different PWM controller's data. Each of the controllers is aware of the correspondence between particular slots and the data that should be transmitted in those slots, so they can drive their data onto the interconnects at the appropriate times and read other controllers' data from the interconnects at the appropriate times. In one embodiment, interconnect 650 is configured to operate in a four-slot network mode, with 24 bits per slot. PWM controllers 610, 620 and 630 are designed to operate using an internal sample rate of 100 kHz, so interconnect 650 must support a data transfer rate of 9.6 megabits per second.

Figure 7:
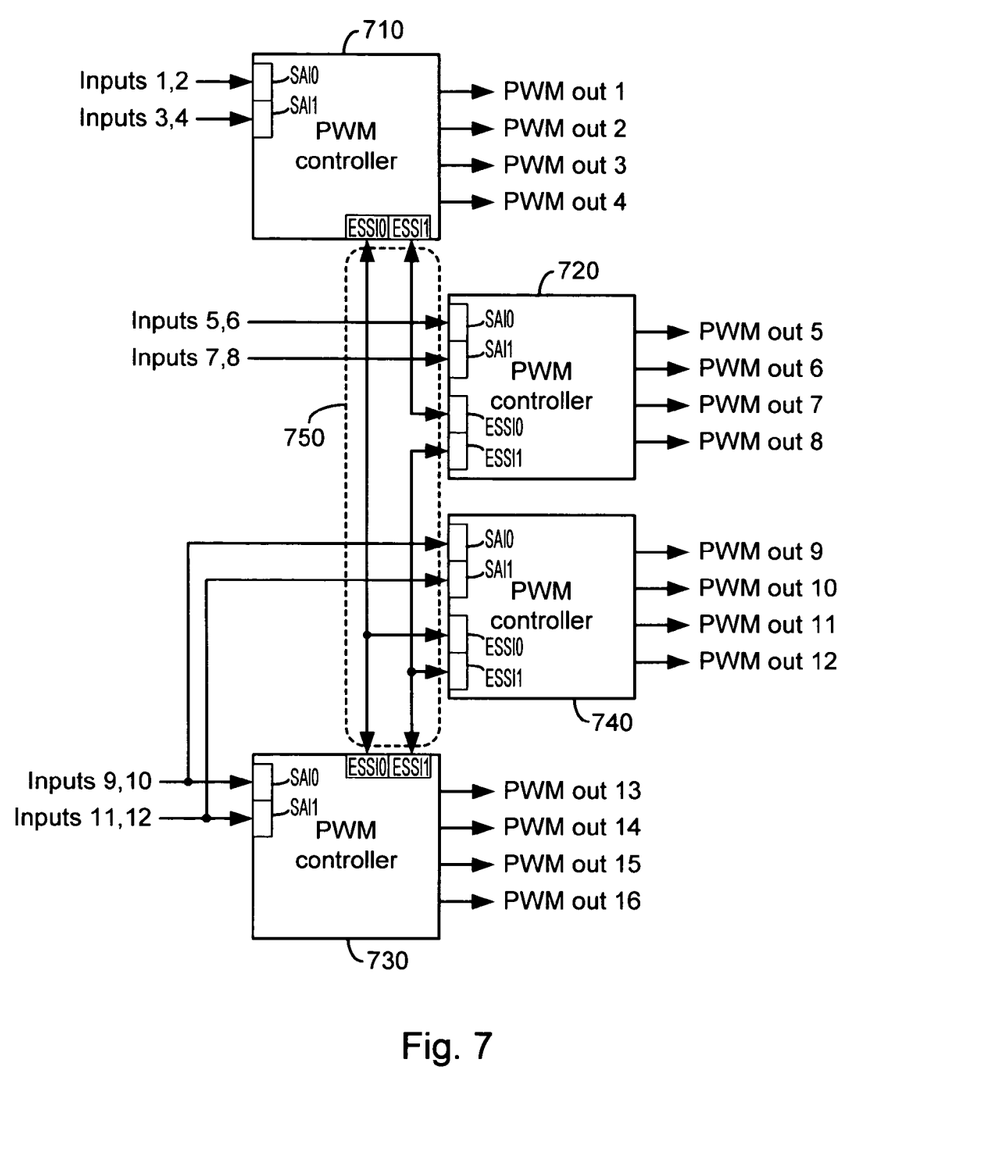
FIG. 7 is a functional block diagram illustrating a multiple-channel, multiple-chip digital audio amplification system in accordance with an alternative embodiment.

Another alternative embodiment of a multi-channel audio amplifier system is shown in FIG. 7. This embodiment is very similar to the embodiment shown in FIG. 6, except that there are four four-channel PWM controller chips, and these chips are configured to accept 12 different input signals and generate 16 output signals. The configuration and interconnection of PWM controllers 710, 720 and 730 are essentially identical to the configuration and interconnection of PWM controllers 610, 620 and 630. System 700, however, also includes a fourth PWM controller, 740. The input and ESSI ports of PWM controller 740 are connected to the corresponding input and ESSI ports of PWM controller 730. As a result, the amount of data that has to be transferred over high-speed interconnect 750 is the same as the amount of data that has to be transferred over high-speed interconnect 650. Interconnect 750 therefore has to support a data transfer rate of 9.6 megabits per second. It is therefore clear that the number of PWM controller chips and output signals is not limited by the data transfer rate that can be supported by the interconnect between them. If, rather than having 12 different input signals, system 700 were configured to accept 16 different input signals, additional bandwidth would be required in high-speed interconnect 750. Interconnect 750 could, for example, be configured to operate in an eight-slot network mode, with 24 bits per slot. If the PWM controllers operate with an internal sample rate of 100 kHz, high-speed interconnect 750 would have to support a data transfer rate of 19.2 megabits per second.

While the present invention has been described with reference to particular embodiments, it should be understood that the embodiments are illustrative and that the scope of the invention is not limited to these embodiments. Many variations, modifications, additions and improvements to the embodiments described above are possible. It is contemplated that these variations, modifications, additions and improvements fall within the scope of the invention as detailed within the claims below.

Those of skill in the art will understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. The information and signals may be communicated between components of the disclosed systems using any suitable transport media, including wires, metallic traces, vias, optical fibers, and the like.

Those of skill will further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Those of skill in the art may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with general purpose processors, digital signal processors (DSPs) or other logic devices, application specific integrated circuits (ASICs), field programmable gate arrays (FPGAs), discrete gates or transistor logic, discrete hardware components, or any combination thereof designed to perform the functions described herein. A general purpose processor may be any conventional processor, controller, microcontroller, state machine or the like. A processor may also be implemented as a combination of computing devices, e.g., a combination of a DSP and a microprocessor, a plurality of microprocessors, one or more microprocessors in conjunction with a DSP core, or any other such configuration.

The steps of the methods or algorithms described in connection with the embodiments disclosed herein may be embodied directly in hardware, in software or firmware modules executed by a processor, or in a combination thereof. A software product may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

The benefits and advantages which may be provided by the present invention have been described above with regard to specific embodiments. These benefits and advantages, and any elements or limitations that may cause them to occur or to become more pronounced are not to be construed as critical, required, or essential features of any or all of the claims. As used herein, the terms "comprises," "comprising," or any other variations thereof, are intended to be interpreted as non-exclusively including the elements or limitations which follow those terms. Accordingly, a system, method, or other embodiment that comprises a set of elements is not limited to only those elements, and may include other elements not expressly listed or inherent to the claimed embodiment.

What is claimed is:

1. A system comprising:
a plurality of audio amplifier channels each including
a sample rate converter (SRC),
a pulse width modulation (PWM) modulator downstream of the SRC, and
an output stage downstream of the PWM modulator, and
wherein each of the audio amplifier channels is configured
to receive a corresponding digital audio signal having a corresponding sample rate, and
to use the SRC of the audio amplifier channel to convert the corresponding digital audio signal to a common predetermined digital data format having a common predetermined sample rate; and
a data transport medium coupled to each of the audio amplifier channels downstream of the SRCs of the plurality of audio amplifier channels;
wherein the SRCs are configured to cause all the digital audio signals downstream of the SRCs in the plurality of audio amplifier channels to have the common predetermined digital data format having the common predetermined sample rate even when the sample rates of the plurality of the digital audio signals upstream of the SRCs differ from one another;
wherein the data transport medium is configured to transmit digital audio signals in the common predetermined digital data format having the common predetermined sample rate from one or more of the audio amplifier channels to one or more others of the audio amplifier channels;
wherein one or more of the audio amplifier channels is also configured
to receive, via the data transport medium, audio signals in the common predetermined digital data format having the common predetermined sample rate from one or more of the other audio amplifier channels,
to select one or more of the audio signals in the common predetermined digital data format having the common predetermined sample rate, and
to provide an output signal based on the one or more selected audio signals.

2. The system of claim 1, wherein the data transport medium comprises a matrix switch.

3. The system of claim 1, wherein the data transport medium comprises a bus.

4. The system of claim 3, wherein the bus is configured to transport the digital audio data in a time division multiplexed manner.

5. The system of claim 1, further comprising control logic configured to control transport of the audio signals in the predetermined digital data format between one or more of the audio amplifier channels.

6. The system of claim 5, wherein the control logic is internal to one or more of the audio amplifier channels.

7. The system of claim 5, wherein the control logic is external to the audio amplifier channels.

8. The system of claim 1, wherein the audio amplifier channels are implemented in a plurality of separate chips.

9. The system of claim 8, further comprising a synchronization system configured to synchronize ones of the audio amplifier channels implemented in different chips.

10. The system of claim 1, wherein each of the audio amplifier channels further comprises an audio effects processor.

11. The system of claim 10, wherein each of the audio amplifier channels further comprises a PWM modulator.

12. The system of claim 11, wherein the sample rate converter, audio effects processor and PWM modulator are implemented in a PWM controller.

13. The system of claim 1, wherein each of the audio amplifier channels comprises a digital PWM amplifier channel.

14. The system of claim 1, wherein one or more of the audio amplifier channels is configured to generate a composite audio signal based on at least two of the selected audio signals and to provide the composite audio signal as the output signal.

15. The system of claim 1, wherein each of the audio amplifier channels is configured to receive the corresponding audio signal at an input sample rate which is unknown, to estimate the input sample rate, and to convert the corresponding audio signal from the input sample rate to a predetermined digital data format.

16. The system of claim 1, wherein the data transport medium is configured to provide the audio signals from each of the audio amplifier channels to all of the other audio amplifier channels.

17. The system of claim 1, wherein the data transport medium comprises a matrix switch that is configured to transmit the audio signal from all of the audio amplifier channels to any one of the other audio amplifier channels.

18. The system of claim 1, wherein each of the audio amplifier channels comprises an input portion and an output portion, wherein each of the audio amplifier channels is controllable to provide at the corresponding output portion a signal received at any one of the input portions of the other audio amplifier channels.

19. The system of claim 2, wherein the matrix switch has N inputs and N outputs, where N is an integer equal to a number of audio amplifier channels are in the plurality of audio amplifier channels.

20. The system of claim 1, wherein the data transport medium is coupled to each of the audio amplifier channels upstream of the output stages of the plurality of audio amplifier channels.

21. A method comprising:
receiving digital audio signals in a plurality of audio amplifier channels, each of the digital audio signals having a corresponding sample rate, with the corresponding sample rate of one of the digital audio signals received in one of the audio amplifier channels differing from the corresponding sample rate of another one of the digital audio signals received in another one of the audio amplifier channels;
converting the digital audio signals received in all of the plurality of audio amplifier channels to a single predetermined digital format having a single predetermined sample rate, so that all the digital audio signals downstream of the converting in the plurality of audio amplifier channels have the common predetermined digital data format having the common predetermined sample rate even when the sample rates of the digital audio signals received in the plurality of audio amplifier channels differ from one another;
transmitting the converted digital audio signals from at least a first one of the audio amplifier channels to a second one of the audio amplifier channels;

in the second one of the audio amplifier channels, selecting at least one audio signal from the transmitted, converted digital audio signals and a locally converted audio signal; and the second one of the audio amplifier channels processing the selected at least one audio signal to generate a corresponding output audio signal.

22. The method of claim 21, further comprising synchronizing the audio amplifier channels.

23. The method of claim 22, wherein synchronizing the audio amplifier channels comprises synchronizing a plurality of chips containing the audio amplifier channels.

24. The method of claim 21, wherein at least two audio signals are selected and are processed to form a composite output audio signal.

25. The method of claim 21, wherein the converted audio signals from at least a first one of the audio amplifier channels are transmitted to a second one of the audio amplifier channels via a matrix switch.

26. The method of claim 21, wherein the converted audio signals from at least a first one of the audio amplifier channels are transmitted to a second one of the audio amplifier channels via a bus.

27. The method of claim 21, wherein the converted audio signals from at least a first one of the audio amplifier channels are transmitted to a second one of the audio amplifier channels in a time division multiplexed manner.

28. The method of claim 21, wherein transmitting the converted audio signals from at least a first one of the audio amplifier channels to a second one of the audio amplifier channels is controlled by logic external to a chip containing the audio amplifier channels.

29. The method of claim 21, wherein transmitting the converted audio signals from at least a first one of the audio amplifier channels to a second one of the audio amplifier channels is controlled by logic internal to a chip containing the audio amplifier channels.

30. The method of claim 21, wherein the second one of the audio amplifier channels processing the selected at least one audio signal to generate the corresponding output audio signal comprises pulse-width modulating the at least one audio signal.

31. The method of claim 21, wherein the second one of the audio amplifier channels processing the selected at least one audio signal to generate the corresponding output audio signal comprises performing audio effects processing on the at least one audio signal.

32. The method of claim 21, further comprising selectively controlling each of the audio amplifier channels to produce an output audio signal corresponding to selected ones of the received audio signals.

33. The method of claim 21, wherein receiving the audio signals in the plurality of audio amplifier channels comprises receiving the audio signals at a plurality of different sample rates.

34. A system comprising:
a plurality of audio amplifier channels each including
a sample rate converter (SRC),
a pulse width modulation (PWM) modulator downstream of the SRC, and
an output stage downstream of the PWM modulator, and wherein each of the audio amplifier channels is configured
to receive a corresponding digital audio signal having a corresponding sample rate, and
to use the SRC of the audio amplifier channel to convert the corresponding digital audio signal to a common predetermined digital data format having a common predetermined sample rate; and
a matrix switch coupled to each of the audio amplifier channels downstream of the SRCs of the plurality of audio amplifier channels;
wherein the SRCs are configured to cause all the digital audio signals downstream of the SRCs in the plurality of audio amplifier channels to have the common predetermined digital data format having the common predetermined sample rate even when the sample rates of the plurality of the digital audio signals upstream of the SRCs differ from one another; and
wherein the matrix switch is configured to transmit digital audio signals in the common predetermined digital data format having the common predetermined sample rate from one or more of the audio amplifier channels to one or more others of the audio amplifier channels.

35. The system of claim 34, wherein one or more of the audio amplifier channels is also configured to:
receive, via the matrix switch, audio signals in the common predetermined digital data format having the common predetermined sample rate from one or more of the other audio amplifier channels;
select one or more of the audio signals in the common predetermined digital data format having the common predetermined sample rate; and
provide an output signal based on the one or more selected audio signals.

36. The system of claim 34, wherein the matrix switch is coupled to each of the audio amplifier channels upstream of the output stages of the plurality of audio amplifier channels.

* * * * *